US012593595B2

(12) United States Patent
Kitazawa et al.

(10) Patent No.: US 12,593,595 B2
(45) Date of Patent: Mar. 31, 2026

(54) DISPLAY DEVICE HAVING AN OPTICAL ADJUSTMENT ELEMENT SWITCHABLE BETWEEN LIGHT CHANGING STATES

(71) Applicant: SHARP KABUSHIKI KAISHA, Sakai City (JP)

(72) Inventors: Tazuko Kitazawa, Sakai City (JP); Yoshihiro Ueta, Sakai City (JP); Eiji Satoh, Sakai City (JP); Zenken Kin, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 373 days.

(21) Appl. No.: 18/272,915

(22) PCT Filed: Jan. 22, 2021

(86) PCT No.: PCT/JP2021/002308
§ 371 (c)(1),
(2) Date: Jul. 18, 2023

(87) PCT Pub. No.: WO2022/157943
PCT Pub. Date: Jul. 28, 2022

(65) Prior Publication Data
US 2024/0349571 A1     Oct. 17, 2024

(51) Int. Cl.
*H10K 59/50* (2023.01)
*H10K 50/115* (2023.01)
*H10K 59/38* (2023.01)

(52) U.S. Cl.
CPC ........... *H10K 59/50* (2023.02); *H10K 50/115* (2023.02); *H10K 59/38* (2023.02)

(58) Field of Classification Search
CPC ...... H10K 59/50; H10K 50/115; H10K 59/38; H10K 33/02; H10K 33/12; H10K 33/14
See application file for complete search history.

(56) References Cited

U.S. PATENT DOCUMENTS

| | | | |
|---|---|---|---|
| 2012/0069064 A1 | 3/2012 | Yamakita | |
| 2012/0099047 A1 | 4/2012 | Lee | |
| 2015/0287768 A1 | 10/2015 | Sato | |
| 2016/0042696 A1* | 2/2016 | Hirakata | G06F 1/1641 |
| | | | 345/207 |
| 2016/0238917 A1* | 8/2016 | Zhang | G02F 1/1677 |
| 2019/0058018 A1 | 2/2019 | Guo | |
| 2019/0280235 A1 | 9/2019 | Kim et al. | |

(Continued)

FOREIGN PATENT DOCUMENTS

| | | | |
|---|---|---|---|
| JP | 2005-010323 A | 1/2005 | |
| JP | 2015-201314 A | 11/2015 | |

(Continued)

*Primary Examiner* — Donald L Raleigh
(74) *Attorney, Agent, or Firm* — ScienBiziP, P.C.

(57) ABSTRACT

This display device includes a first electrode and a second electrode overlapping each other in a plan view, a light-emitting layer containing quantum dots and overlapping the first electrode and the second electrode in a plan view, a third electrode capable of forming an electrical field between the second electrode and third electrode, and an optical adjustment element overlapping the light-emitting layer in a plan view and having light transmittance that changes in accordance with a potential difference between the second electrode and the third electrode.

19 Claims, 12 Drawing Sheets

(56)        References Cited

U.S. PATENT DOCUMENTS

| | | | |
|---|---|---|---|
| 2020/0295288 A1* | 9/2020 | Fusella | ................ H01Q 9/0442 |
| 2020/0295293 A1 | 9/2020 | Menon et al. | |
| 2021/0119164 A1 | 4/2021 | Kim et al. | |
| 2021/0249633 A1 | 8/2021 | Fusella et al. | |
| 2021/0265584 A1 | 8/2021 | Fusella et al. | |
| 2022/0149315 A1 | 5/2022 | Menon et al. | |
| 2023/0129581 A1 | 4/2023 | Fusella et al. | |

FOREIGN PATENT DOCUMENTS

| | | |
|---|---|---|
| JP | 2016-038586 A | 3/2016 |
| JP | 2019-091640 A | 6/2019 |
| JP | 2019-160796 A | 9/2019 |
| JP | 2020-520039 A | 7/2020 |
| JP | 2020-149974 A | 9/2020 |
| WO | 2011/058725 A1 | 5/2011 |

* cited by examiner

5
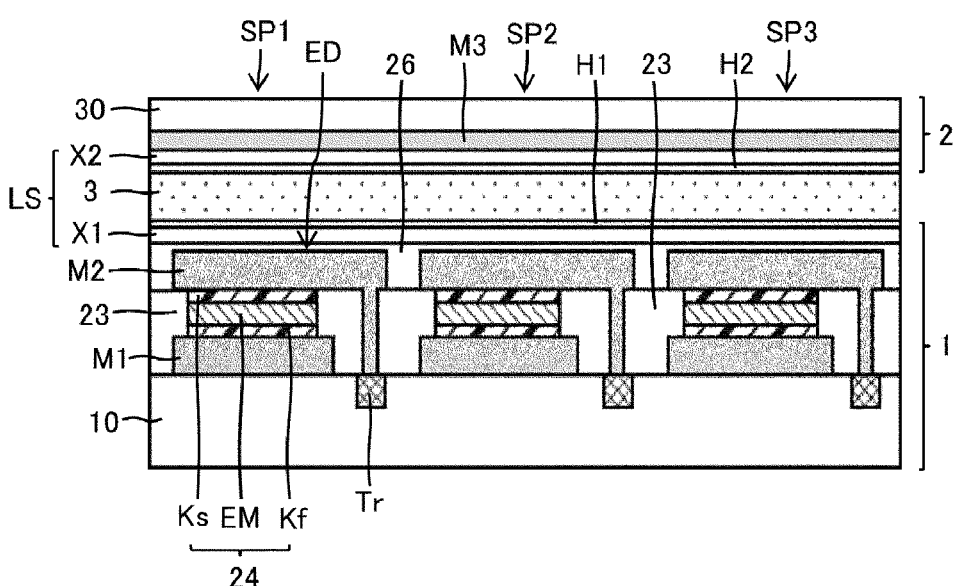
FIG. 1

(a)

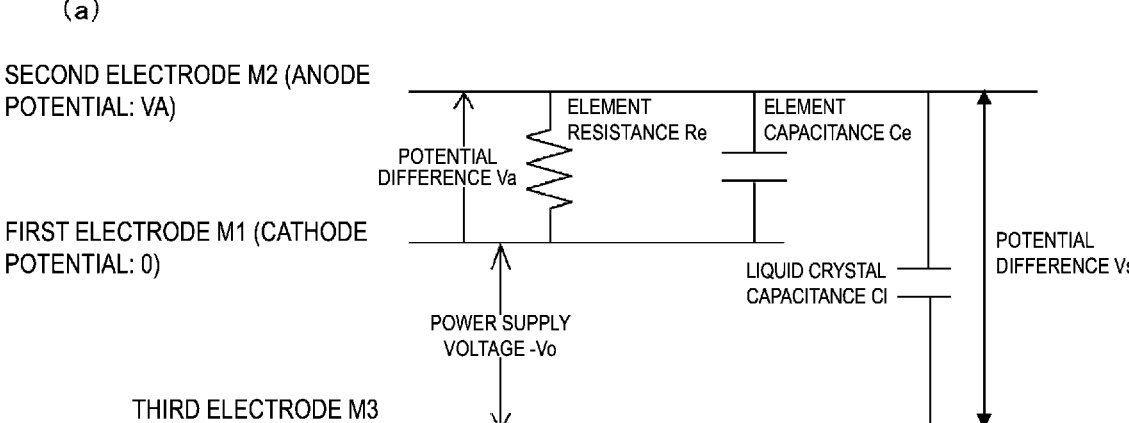

SECOND ELECTRODE M2 (ANODE POTENTIAL: VA)

FIRST ELECTRODE M1 (CATHODE POTENTIAL: 0)

THIRD ELECTRODE M3 (COUNTER POTENTIAL: VN)

POTENTIAL DIFFERENCE Va

ELEMENT RESISTANCE Re

ELEMENT CAPACITANCE Ce

LIQUID CRYSTAL CAPACITANCE Cl

POTENTIAL DIFFERENCE Vs

POWER SUPPLY VOLTAGE -Vo (b)
LIGHT EMISSION INTENSITY (c)

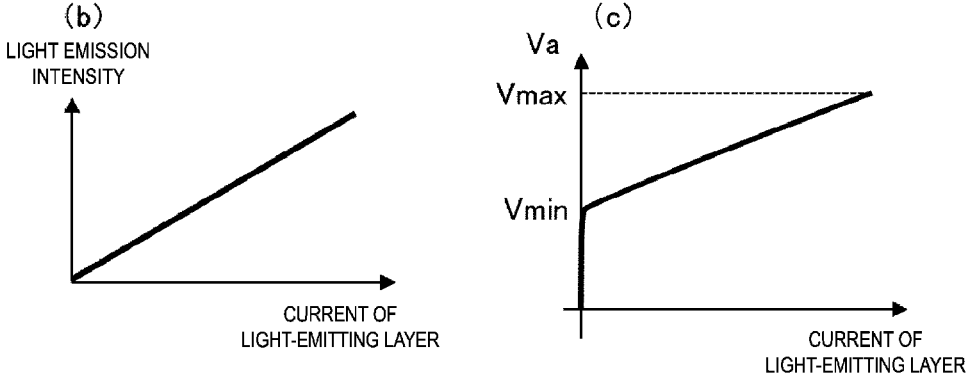

CURRENT OF LIGHT-EMITTING LAYER

Va

Vmax

Vmin

CURRENT OF LIGHT-EMITTING LAYER (d)
LIGHT EMISSION INTENSITY (e)
TRANSMITTANCE OF LS

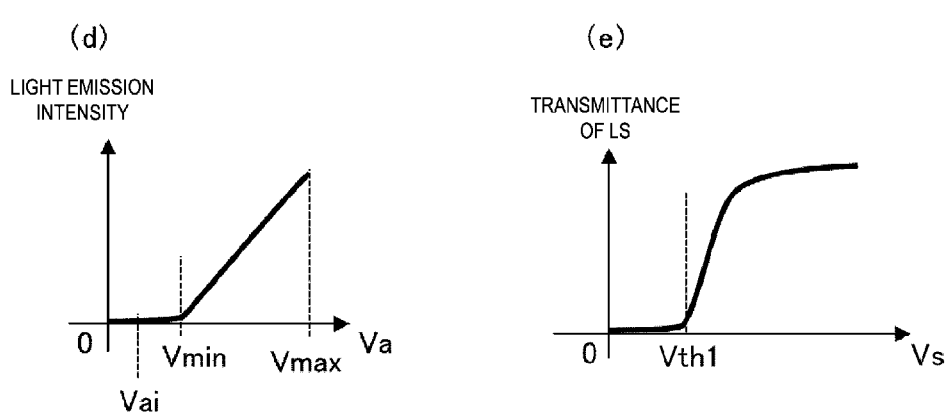

0     Vmin     Vmax     Va

Vai

0     Vth1     Vs

FIG. 2

(a)
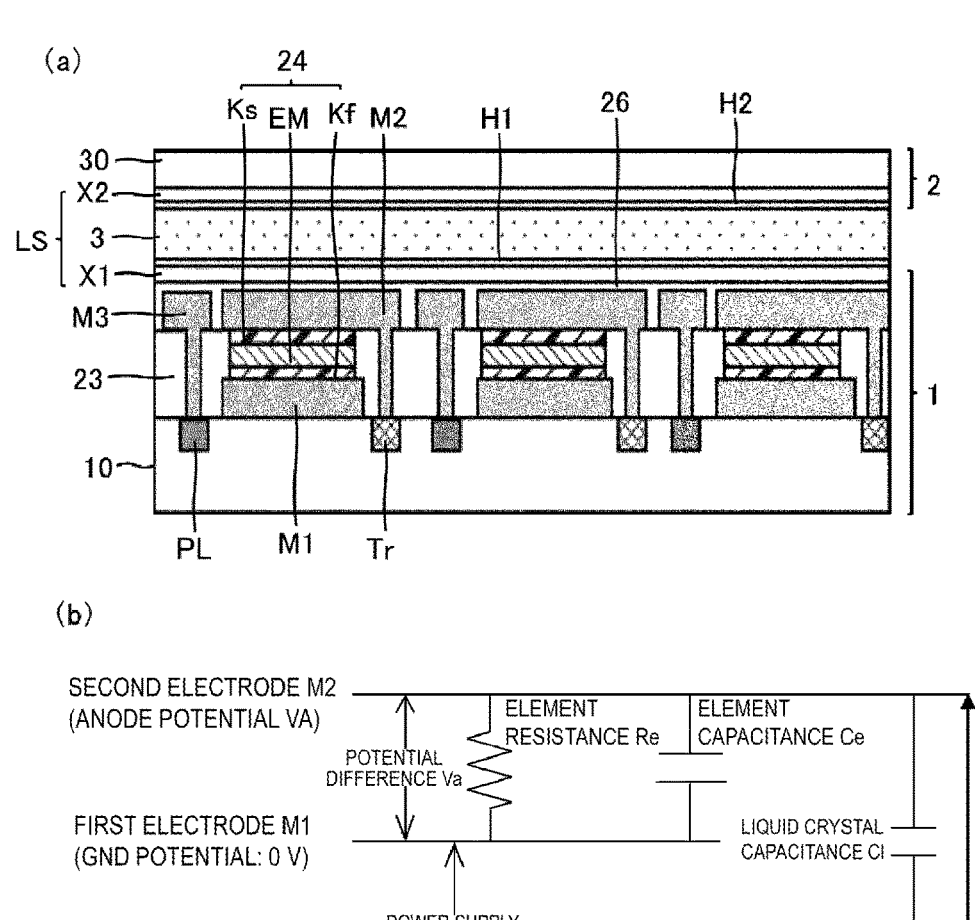
(b)
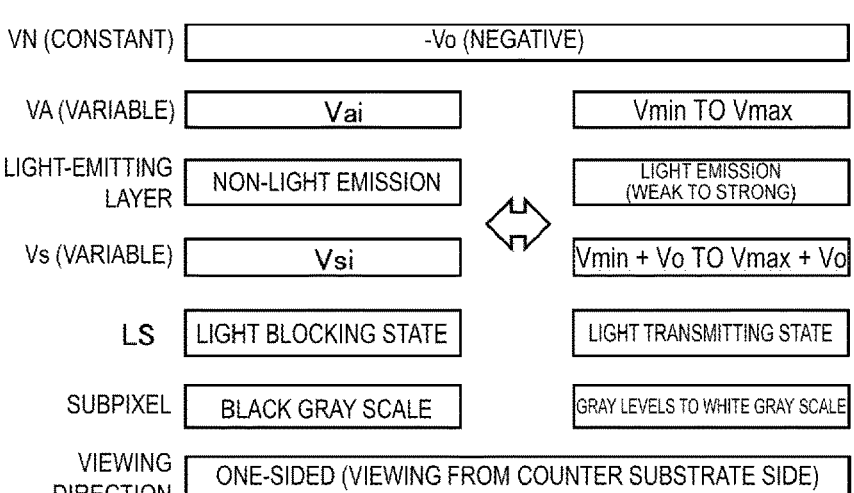
(c)
| | | | |
|---|---|---|---|
| VN (CONSTANT) | -Vo (NEGATIVE) | | |
| VA (VARIABLE) | Vai | | Vmin TO Vmax |
| LIGHT-EMITTING LAYER | NON-LIGHT EMISSION | | LIGHT EMISSION (WEAK TO STRONG) |
| Vs (VARIABLE) | Vsi | | Vmin + Vo TO Vmax + Vo |
| LS | LIGHT BLOCKING STATE | | LIGHT TRANSMITTING STATE |
| SUBPIXEL | BLACK GRAY SCALE | | GRAY LEVELS TO WHITE GRAY SCALE |
| VIEWING DIRECTION | ONE-SIDED (VIEWING FROM COUNTER SUBSTRATE SIDE) | | |
FIG. 7

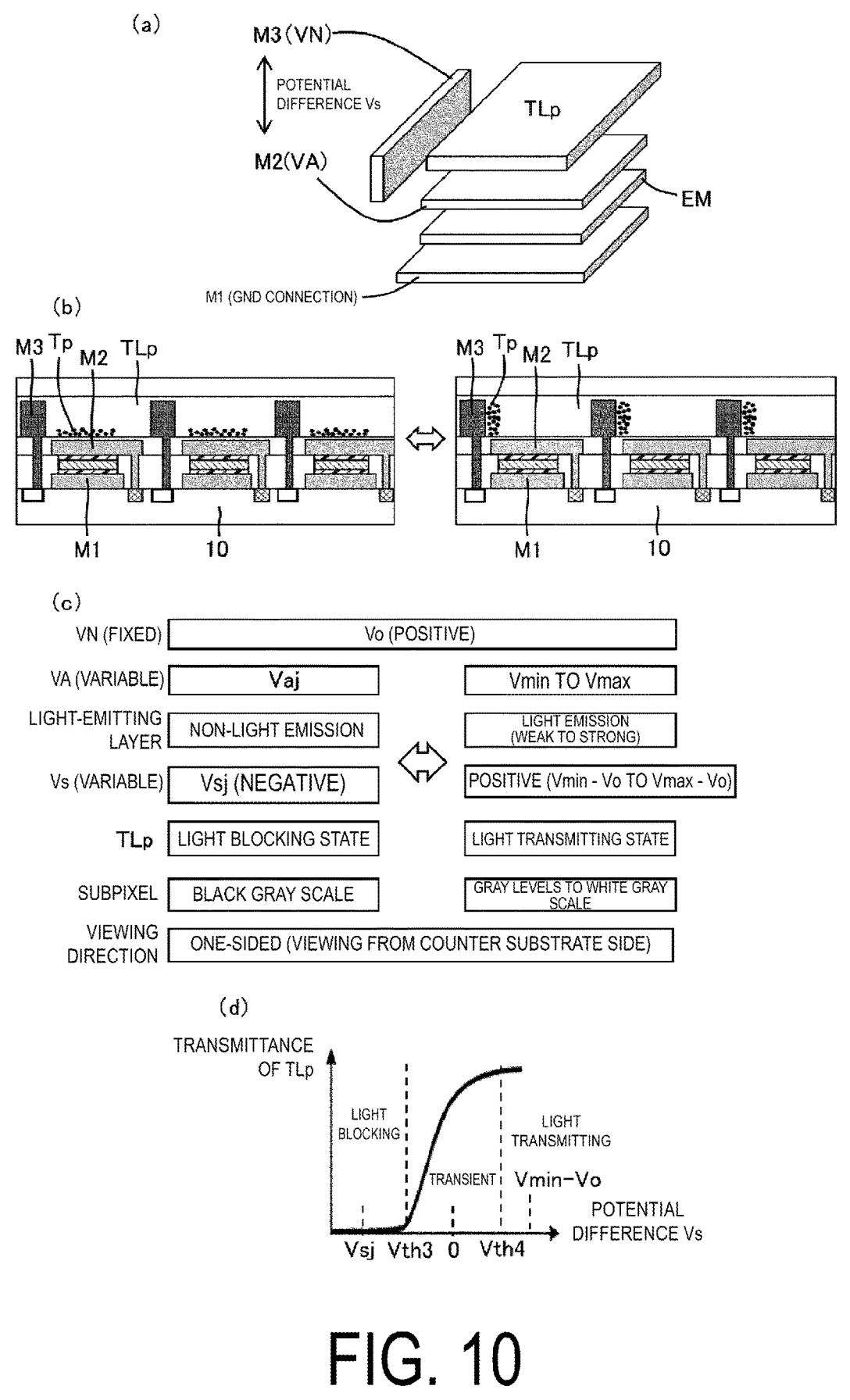

(a)

M3(VN)

POTENTIAL
DIFFERENCE Vs

TLp

M2(VA)

EM

M1 (GND CONNECTION)

(b)

M3 Tp M2 TLp

M1     10

M3 Tp M2 TLp

M1     10

(c)

| VN (FIXED) | Vo (POSITIVE) | |
|---|---|---|
| VA (VARIABLE) | Vaj | Vmin TO Vmax |
| LIGHT-EMITTING LAYER | NON-LIGHT EMISSION | LIGHT EMISSION (WEAK TO STRONG) |
| Vs (VARIABLE) | Vsj (NEGATIVE) | POSITIVE (Vmin - Vo TO Vmax - Vo) |
| TLp | LIGHT BLOCKING STATE | LIGHT TRANSMITTING STATE |
| SUBPIXEL | BLACK GRAY SCALE | GRAY LEVELS TO WHITE GRAY SCALE |
| VIEWING DIRECTION | ONE-SIDED (VIEWING FROM COUNTER SUBSTRATE SIDE) | |

(d)

TRANSMITTANCE
OF TLp

LIGHT
BLOCKING

TRANSIENT

LIGHT
TRANSMITTING $Vmin-Vo$

POTENTIAL
DIFFERENCE Vs

Vsj  Vth3  0  Vth4

FIG. 10

(a)
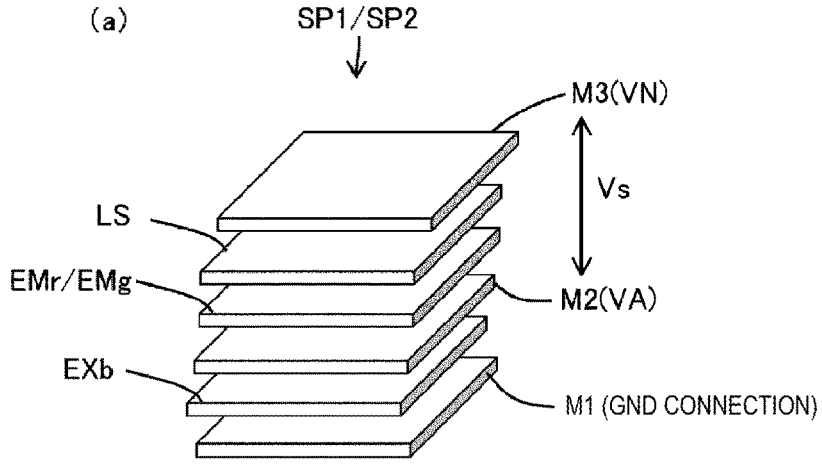
(b)
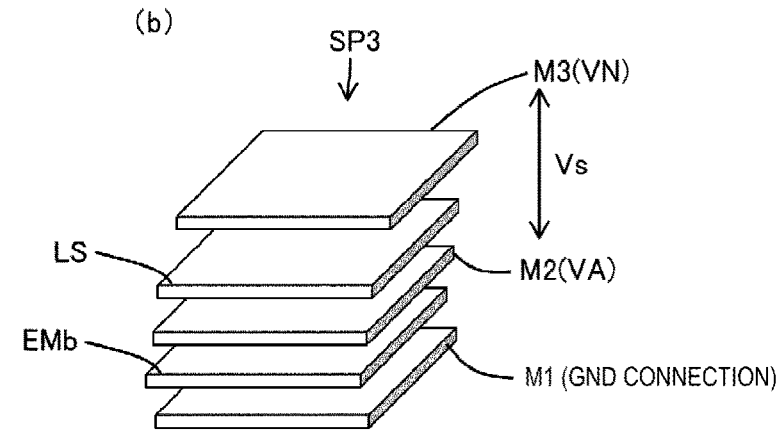
(c)
| VN (CONSTANT) | -Vo (NEGATIVE) | |
|---|---|---|
| VA (VARIABLE) | Vai | Vmin TO Vmax |
| LIGHT-EMITTING LAYER | NON-LIGHT EMISSION | LIGHT EMISSION (WEAK TO STRONG) |
| Vs (VARIABLE) | Vsi | Vmin + Vo TO Vmax + Vo |
| LS | LIGHT BLOCKING STATE | LIGHT TRANSMITTING STATE |
| SUBPIXEL | BLACK GRAY SCALE | GRAY LEVELS TO WHITE GRAY SCALE |
| VIEWING DIRECTION | ONE-SIDED (VIEWING FROM COUNTER SUBSTRATE SIDE) | |
FIG. 12

DISPLAY DEVICE HAVING AN OPTICAL ADJUSTMENT ELEMENT SWITCHABLE BETWEEN LIGHT CHANGING STATES

TECHNICAL FIELD

The disclosure relates to a display device.

BACKGROUND ART

PTL 1 discloses a display device containing quantum dots in a light-emitting layer.

CITATION LIST

Patent Literature

PTL 1: JP 2019-160796 A

SUMMARY

Technical Problem

Such a display device has a problem that it is difficult to display a deep (high-purity) black color due to a phenomenon in which quantum dots emit light due to external light incident from a viewing surface (photoluminescence).

Solution to Problem

A display device according to one aspect of the disclosure includes a first electrode and a second electrode overlapping each other in a plan view, a light-emitting layer containing quantum dots and overlapping the first electrode and the second electrode in a plan view, a third electrode capable of forming an electrical field between the second electrode and the third electrode, and an optical adjustment element overlapping the light-emitting layer in a plan view and having light transmittance that changes in accordance with a potential difference between the second electrode and the third electrode.

Advantageous Effects of Disclosure

According to the one aspect of the disclosure, the optical adjustment element can suppress incidence of external light from a viewing surface, thus displaying a deep (high-purity) black color.

BRIEF DESCRIPTION OF DRAWINGS

FIG. 1 is a cross-sectional view illustrating a configuration of a display device according to a first embodiment.

FIG. 2(a) is an explanatory diagram illustrating potentials of first to third electrodes, FIG. 2(b) is a graph showing a characteristic of current of a light-emitting layer and light emission intensity, FIG. 2(c) is a graph showing a characteristic of the current of the light-emitting layer and voltage, FIG. 2(d) is a graph showing a characteristic of the voltage of the light-emitting layer and the light emission intensity, and FIG. 2(e) is a graph showing a characteristic of voltage of an optical adjustment element and transmittance.

FIG. 7(a) is a cross-sectional view illustrating a further modified example of the display device according to the first embodiment, FIG. 7(b) is an explanatory diagram illustrating the potentials of the first to third electrodes, and FIG. 7(c) is an explanatory diagram illustrating operation of the display device.

FIG. 10(a) is an explanatory diagram illustrating potentials of first to third electrodes of the second embodiment, FIG. 10(b) is a schematic view illustrating operation of the display device, FIG. 10(c) is an explanatory diagram illustrating the operation of the display device, and FIG. 10(d) is a graph showing a characteristic of voltage of an optical adjustment element and transmittance.

FIG. 12(a) is a schematic view illustrating a layered structure of a first subpixel and a second subpixel, FIG. 12(b) is a schematic view illustrating a layered structure of a third subpixel, and FIG. 12(c) is an explanatory diagram illustrating operation of the display device.

DESCRIPTION OF EMBODIMENTS

First Embodiment

Figure 3:
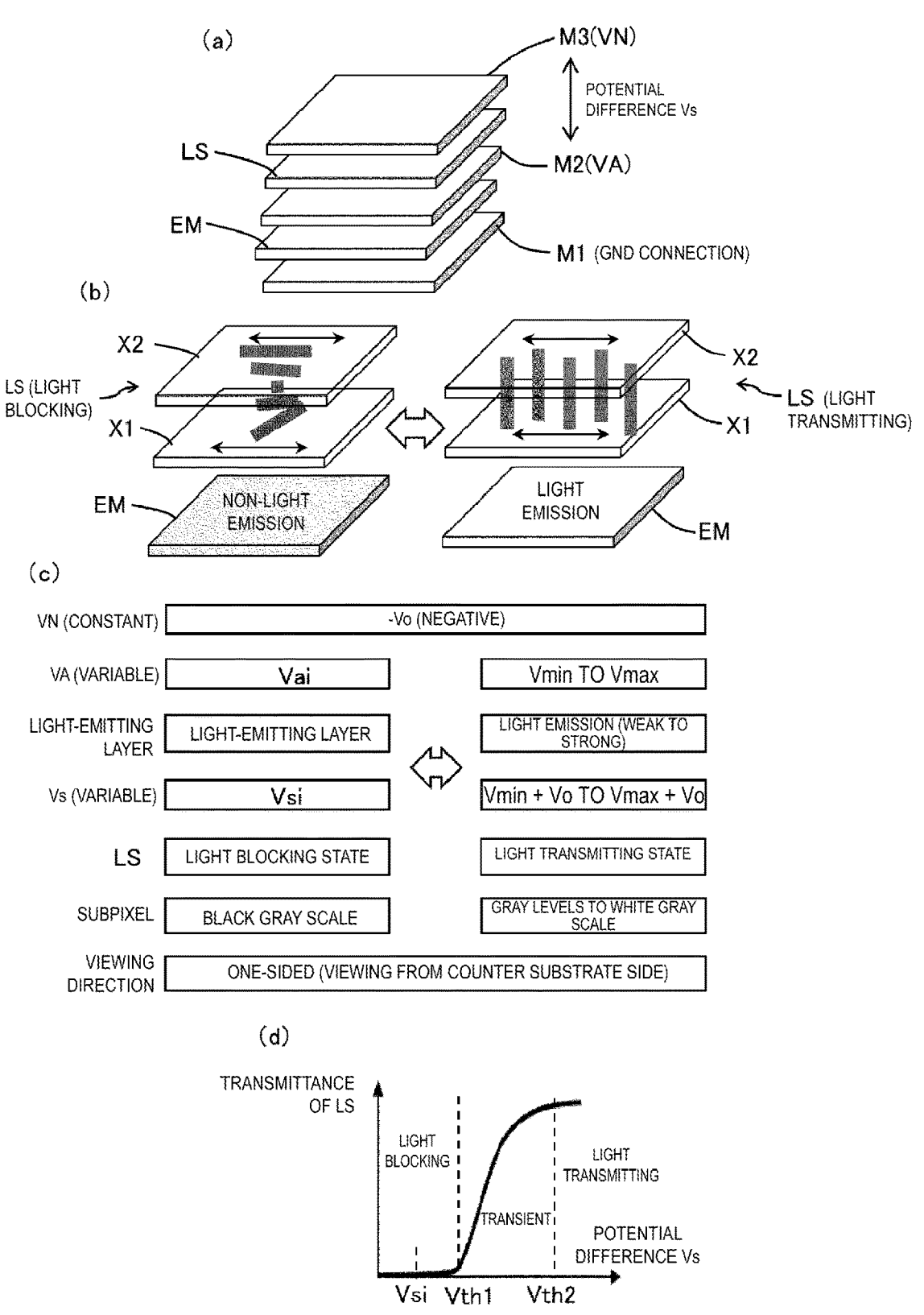
FIG. 3(a) is a schematic view illustrating a layered structure of the light-emitting layer and the first to third electrodes of the first embodiment.
FIG. 3(b) is a schematic view illustrating states of the optical adjustment element and the light-emitting layer.
FIG. 3(c) is an explanatory diagram illustrating operation of the display device.
FIG. 3(d) is a graph showing a characteristic of the voltage of the optical adjustment element and the transmittance.

FIG. 1 is a cross-sectional view illustrating a configuration of a display device according to a first embodiment. As illustrated in FIG. 1, a display device 5 includes a first member 1, a second member 2 facing the first member 1, and a liquid crystal layer 3 placed between the first member 1 and the second member 2. In the first member 1, first electrodes M1, an edge cover film 23, electroluminescent (EL) layers 24, second electrodes M2, a sealing layer 26, a first polarizer X1, and a first alignment film H1 are provided in this order on a TFT substrate 10 including multiple thin film transistors Tr. In the second member 2, a third electrode M3, a second polarizer X2, and a second alignment film H2 are provided in this order on a counter substrate 30.

Hereinafter, a direction from the TFT substrate 10 to the counter substrate 30 is described as "upward direction", and a direction from the counter substrate 30 to the TFT substrate 10 is described as "downward direction" in FIG. 1. In other words, "lower layer" means a layer that is formed in a process prior to that of a comparison layer, and "upper layer" means a layer that is formed in a process after that of a comparison layer.

The display device 5 is of a top emission type and is viewed from a counter substrate 30 side. The first electrode M1 has light reflectivity and the second electrode M2, the sealing layer 26, the third electrode M3, and the counter substrate 30 have a light transmitting property. The TFT substrate 10 may have a light blocking property.

The TFT substrate 10 is obtained, for example, by forming an undercoat layer and a thin film transistor layer (TFT layer) on a base material made of glass, resin, or the like. The edge cover film 23 is an insulating film that covers edges of the first electrodes M1. The sealing layer 26 is a layer that prevents penetration of foreign matters such as water and oxygen. The first polarizer X1 may be a polarizing film coated on the sealing layer 26, or may be a polarizer bonded on the sealing layer 26. The same applies to the second polarizer X2.

The first member 1 and the second member 2 are disposed to face each other such that the first alignment film H1 and the second alignment film H2 are in contact with the liquid crystal layer 3, and the first polarizer X1, the first alignment film H1, the liquid crystal layer 3, the second alignment film H2, and the second polarizer X2 form an optical adjustment element LS (liquid crystal cell).

The EL layer 24 of the first member 1 includes a first charge transport layer Kf, a light-emitting layer EM (electroluminescent layer), and a second charge transport layer Ks. The first electrode M1, the EL layer 24, and the second electrode M2 constitute a light-emitting element ED. The first charge transport layer Kf and the second charge transport layer Ks have a light transmitting property. The light-emitting element ED is a quantum dot light emitting diode (QLED) provided on a subpixel-by-subpixel basis, and the light-emitting layer EM is a quantum dot light-emitting layer. The third electrode M3 is a counter electrode facing the multiple light-emitting elements ED.

The display device 5 includes a first subpixel SP1 that emits red light, a second subpixel SP2 that emits green light, and a third subpixel SP3 that emits blue light. Each of the first subpixel SP1, the second subpixel SP2, and the third subpixel SP3 includes the first electrode M1, the second electrode M2, the light-emitting layer EM, and the optical adjustment element LS. The third electrode M3 is common to the first subpixel SP1, the second subpixel SP2, and the third subpixel SP3. The light-emitting layer EM of the first subpixel SP1 emits red light, the light-emitting layer EM of the second subpixel SP2 emits green light, and the light-emitting layer EM of the third subpixel SP3 emits blue light.

The first electrode M1 and the second electrode M2 are connected to a pixel circuit (described later) of the TFT substrate 10 and overlap each other in a plan view. The second electrode M2 is connected to the transistor Tr of the TFT substrate 10. The light-emitting layer EM is placed between the first electrode M1 and the second electrode M2, and overlaps the first electrode M1 and the second electrode M2 in a plan view. The third electrode M3 faces the second electrode M2 with the liquid crystal layer 3 interposed therebetween, and can form an electrical field between the second electrode M2 and the third electrode M3. The optical adjustment element LS placed between the second electrode M2 and the third electrode M3 overlaps the light-emitting layer EM in a plan view. Light transmittance of the optical adjustment element LS changes according to a potential difference between the second electrode M2 and the third electrode M3 (=a potential of the second electrode—a potential of the third electrode). The optical adjustment element LS is in one of multiple optical states (e.g., a light blocking state, a light transmitting state, and a transient state) in accordance with this potential difference. Note that "multiple members overlap in a plan view" refers to a state in which at least part of one member and at least part of another member overlap when the multiple members are viewed in, for example, the normal direction of a display surface.

FIG. 2(a) is an explanatory diagram illustrating potentials of the first to third electrodes, FIG. 2(b) is a graph showing a characteristic of current of the light-emitting layer and light emission intensity, FIG. 2(c) is a graph showing a characteristic of the current of the light-emitting layer and voltage, FIG. 2(d) is a graph showing a characteristic of the voltage of the light-emitting layer and the light emission intensity, and FIG. 2(e) is a graph showing a characteristic of voltage of the optical adjustment element and transmittance.

In the first embodiment, as illustrated in FIG. 2, the potential of the first electrode M1 connected to the ground is 0, a potential VA of the second electrode M2 is an anode potential, and a potential VN of the third electrode M3 (counter electrode) is a counter potential. Although a power supply voltage −Vo is applied so that the third electrode M3 is negative with respect to the first electrode M1 in FIG. 2, the power supply voltage is not limited to being negative, and a positive power supply voltage may be applied to the third electrode M3 and the potential VA of the second electrode M2 may be a negative potential.

An element resistance Re and an element capacitance Ce are formed between the first electrode M1 and the second electrode M2. A liquid crystal capacitance Cl is formed between the second electrode M2 and the third electrode M3.

In the light-emitting element ED, when current generated in the light-emitting layer EM (current at the element resistance Re) increases, the light emission intensity of the light-emitting layer EM increases, and the potential difference Va between the second electrode M2 and the first electrode M1 also increases. Due to the element capacitance Ce, no current is generated in the light-emitting layer EM when the potential difference Va is less than Vmin (positive voltage) in FIG. 2, and current is generated in the light-emitting layer EM (the light-emitting layer EM emits light) when the potential difference Va is Vmin or greater in FIG. 2. When the potential difference Va is Vmax, the light emission intensity of the light-emitting layer EM is maximum (luminance corresponding to the maximum gray scale of the subpixel). A potential difference Vs (=VA−VN) between the second electrode M2 and the third electrode M3 is a voltage applied to the liquid crystal capacitance Cl (including the optical adjustment element LS). Since the potential of the first electrode M1 is 0, the potential VN is a value of the power supply voltage −Vo itself, and the potential VA is a value of the potential difference Va itself. When no current is injected (no voltage is applied) to the second electrode M2, the potential difference Va is a divided voltage value Vai determined by Equation 1 below based on a capacitance ratio between the element capacitance Ce and the liquid crystal capacitance Cl.

$$Vai = -Vo \times Ce/(Ce + Cl) \qquad \text{[Equation 1]}$$

FIG. 3(a) is a schematic view illustrating a layered structure of the light-emitting layer and the first to third electrodes of the first embodiment, FIG. 3(b) is a schematic view illustrating states of the optical adjustment element and the light-emitting layer, FIG. 3(c) is an explanatory diagram illustrating operation of the display device, and FIG. 3(d) is a graph showing a characteristic of the voltage of the optical adjustment element and the transmittance.

As illustrated in FIG. 3, in the optical adjustment element LS, a polarization axis of the first polarizer X1 and a polarization axis of the second polarizer X2 are parallel. The optical adjustment element LS is in the light blocking state when the potential VA of the second electrode M2 is low (the potential difference Vs is small), and the optical adjustment element LS is in the light transmitting state when the potential VA of the second electrode M2 is high (the potential difference Vs is large).

Optical states of the optical adjustment element LS in which the polarization axes of the first polarizer X1 and the second polarizer X2 are parallel include the light blocking state in which liquid crystal molecules are substantially lying down, the light transmitting state in which the liquid crystal molecules are substantially standing, and the transient state from the light blocking state to the light transmitting state. The optical adjustment element LS is in the light blocking state when the liquid crystal layer 3 rotates the polarization direction of light (preferably by 90 degrees), and is in the light transmitting state when the polarization direction is not changed. For the potential difference Vs, a threshold value when a state changes from the light blocking state (a state in which the liquid crystal molecules are substantially lying down) to the transient state (a state in which some of the liquid crystal molecules are standing) is a first voltage Vth1, and a threshold value when a state changes from the transient state to the light transmitting state (a state in which the liquid crystal molecules are substantially standing) is a second voltage Vth2. Here, Vth1<Vth2. FIG. 3 illustrates a case in which the liquid crystal layer of the optical adjustment element LS is of a TN system, but the same applies to a vertical alignment (VA) system.

As shown in FIG. 3(d), by setting a value Vsi (=Vo×Cl/(Ce+Cl)) of the potential difference Vs when no current is injected into the second electrode M2 to be less than the first voltage Vth1, and by making the potential difference Vs (=Vmin+Vo) greater than the first voltage Vth1 when current is injected into the second electrode M2 and the potential VA is Vmin, when no current is injected into the second electrode M2, the optical adjustment element LS is in the light blocking state, and when the current is injected into the second electrode M2 and the potential VA is Vmin or higher, the optical adjustment element LS is in the transient state or the light transmitting state. As an example, Vo=0.1 [V], Vth1=1.0 [V], Vmin=2.0 [V], and Vmax=5.0 [V] are assumed. Usually, the light-emitting layer EM has a relative dielectric constant Fe of about 8.0 and a film thickness De of about 50 nm, and the optical adjustment element LS has a relative dielectric constant εl of about 6.0 and a film thickness Dl of about 50 μm. The element capacitance Ce and the liquid crystal capacitance Cl are calculated using Equation 2 and Equation 3 below.

$$Ce = \varepsilon 0 \times \varepsilon e \times S/De \qquad \text{[Equation 2]}$$

$$Cl = \varepsilon 0 \times \varepsilon 1 \times S/Dl \qquad \text{[Equation 3]}$$

where ε0 is a dielectric constant of vacuum and S is an electrode area. From Equations 1 to 3, when no current is injected into the second electrode M2, Vai is −0.099 V and Vsi is 0.001 V, which is smaller than Vth1. When the current is injected into the second electrode M2 and Va is Vmin, Vs is 2.1 V, which is larger than Vth1.

In this way, during a non-light emission period in which the light-emitting layer EM is in a non-light emission state, the optical adjustment element LS is in the light blocking state and the subpixel is displayed in black gray scale, and during a light emission period in which the light-emitting layer EM is in a light emission state, the optical adjustment element LS is in the light transmitting state and the subpixel is displayed in gray levels to white gray scale.

To be more specific, in a case in which the light-emitting layer EM is in the non-light emission state (non-light emission period), when external light is incident on the second polarizer X2, a polarization direction of the external light is controlled to be along the polarization axis of the second polarizer X2. Then, the external light whose polarization direction is controlled to be along the polarization axis of the second polarizer X2 is rotated by the liquid crystal layer 3 so that the polarization direction intersects the polarization axis of the first polarizer X1 and is absorbed by the first polarizer X1. As a result, photoluminescence due to the external light is suppressed in the light-emitting layer EM, and when the light-emitting layer EM is in the non-light emission state (the subpixel is displayed in black gray scale), deterioration in black purity (black floating) due to photoluminescence is suppressed.

On the other hand, when the light-emitting layer EM is in the light emission state (light emission period), a polarization direction of electroluminescence generated in the light-emitting layer EM is controlled by the first polarizer X1 to be along the polarization axis of the first polarizer X1 and is incident on the liquid crystal layer 3, but passes through the liquid crystal layer 3 while the polarization direction is maintained. Since the polarization axes of the first polarizer X1 and the second polarizer X2 are parallel, light passed through the liquid crystal layer 3 passes through the second polarizer X2. Thus, the light generated in the light-emitting layer EM passes to the viewing surface side without being blocked by the optical adjustment element LS. When the light-emitting layer EM is in the light emission state, external light reaches the light-emitting layer EM and photoluminescence generated in the light-emitting layer EM passes to the viewing surface side. However, luminance of the photoluminescence is lower than that of electroluminescence, so the influence on color purity of the subpixel can be ignored.

When the light-emitting layer EM has low luminance and the transmittance of the optical adjustment element LS is desired to be high, Vmin+Vo is set to be greater than Vth2 in FIG. 3(d). When the light-emitting layer EM has low luminance and the transmittance of the optical adjustment element LS is desired to be low, Vmin+Vo is set to be equal to or less than Vth2.

According to the first embodiment, when the light-emitting layer EM is in the light emission state, the optical adjustment element LS is autonomously in the light transmitting state, and when the light-emitting layer EM is in the non-light emission state, the optical adjustment element LS is autonomously in the light blocking state to block external light incident from the viewing surface. Thus, light emission (photoluminescence) of the quantum dots due to external light reaching the light-emitting layer EM in a black display state is suppressed, enabling a high-contrast display that can display a deep (high-purity) black color.

Figure 4:
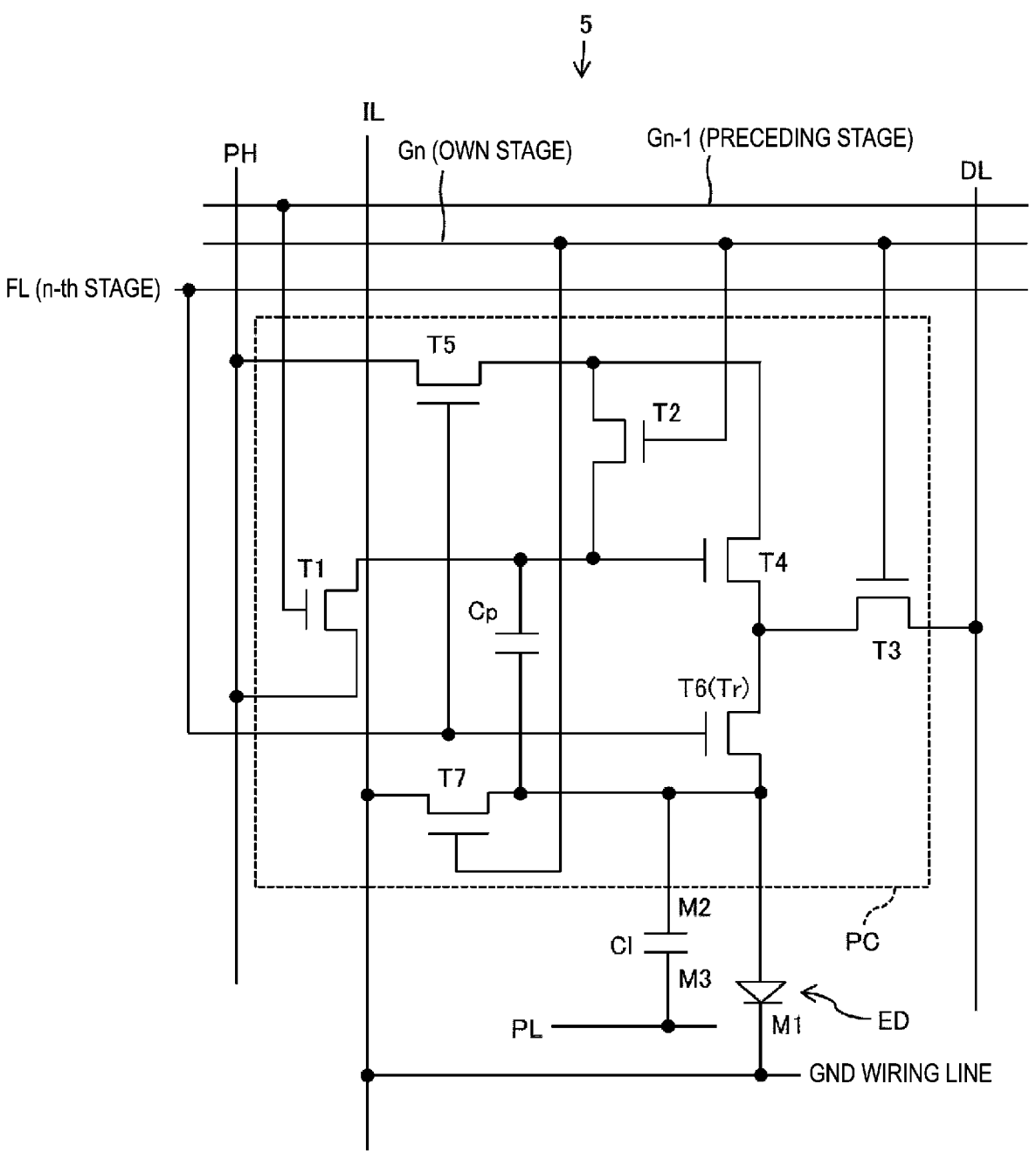
FIG. 4 is a circuit diagram illustrating an example of a connection relationship between a pixel circuit of a TFT substrate and the first to third electrodes.

FIG. 4 is a circuit diagram illustrating an example of a connection relationship between the pixel circuit of the TFT substrate and the first to third electrodes. A pixel circuit PC in FIG. 4 includes a capacitance element Cp, a reset transistor T1 including a gate terminal connected to a scanning signal line Gn−1 for a preceding stage, a threshold control transistor T2 including a gate terminal connected to a scanning signal line Gn for a stage of a pixel circuit PC itself, a writing control transistor T3 including a gate terminal connected to the scanning signal line Gn for the stage of the pixel circuit PC itself, a drive transistor T4 that controls current of the light-emitting element ED, a power supply transistor T5 including a gate terminal connected to a light emission control line FL, a light emission control transistor T6 including a gate terminal connected to the light emission control line FL, and an initialization transistor T7 including a gate terminal connected to the scanning signal line Gn for the stage of the pixel circuit PC itself.

The gate terminal of the drive transistor T4 is connected to an anode (the second electrode M2) of the light-emitting element ED via the capacitance element Cp, and is connected to a power source line PH via the reset transistor T1. A high potential side power supply is supplied to the power source line PH.

A source terminal of the drive transistor T4 is connected to a data signal line DL via the writing control transistor T3, and is connected to the anode of the light-emitting element ED via the light emission control transistor T6 (transistor Tr in FIG. 1). A drain terminal of the drive transistor T4 is connected to the gate terminal of the drive transistor T4 via the threshold control transistor T2, and is connected to the power source line PH via the power supply transistor T5.

The anode of the light-emitting element ED is connected to an initialization signal line IL via the initialization transistor T7. The initialization signal line IL and a cathode of the light-emitting element ED (the first electrode M1) is connected to a ground wiring line (GND wiring line). The third electrode M3 of the second member 2 is connected to a power source line PL that supplies the negative power supply voltage −Vo.

Figure 5:
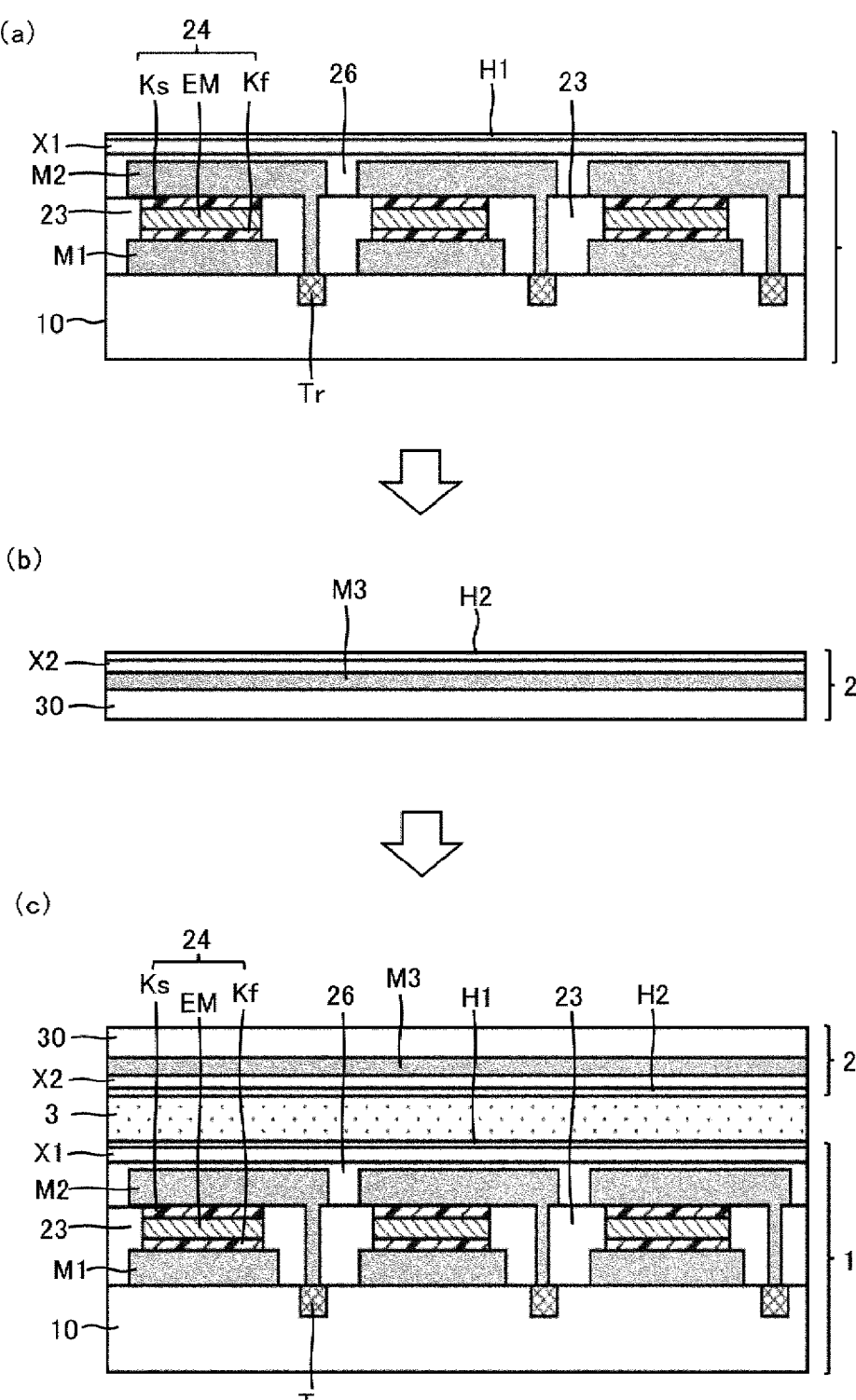
FIGS. 5(a) to 5(c) are cross-sectional views illustrating a manufacturing method of the display device according to the first embodiment.

FIGS. 5(a) to 5(c) are cross-sectional views illustrating a manufacturing method of the display device according to the first embodiment. In FIG. 5(a), the first electrodes M1, the edge cover film 23, the EL layers 24, the second electrodes M2, the sealing layer 26, the first polarizer X1, and the first alignment film H1 are formed in this order on the TFT substrate 10 to form the first member 1. In FIG. 5(b), the third electrode M3, the second polarizer X2, and the second alignment film H2 are formed in this order on the counter substrate 30 to form the second member 2. In FIG. 5(c), the first member 1 and the second member 2 are bonded so that the first alignment film H1 and the second alignment film H2 face each other with a space therebetween, and the liquid crystal layer 3 is sealed in this space.

Here, the first polarizer X1 and the second polarizer X2 may be formed by applying a material that forms a polarization pattern. In this configuration, external light that has passed through the second polarizer X2 reaches the first polarizer X1 without being disturbed in the polarization direction due to scattering or the like, and is blocked. This enables a highly pure black display and is also suitable for flexibility.

Figure 6:
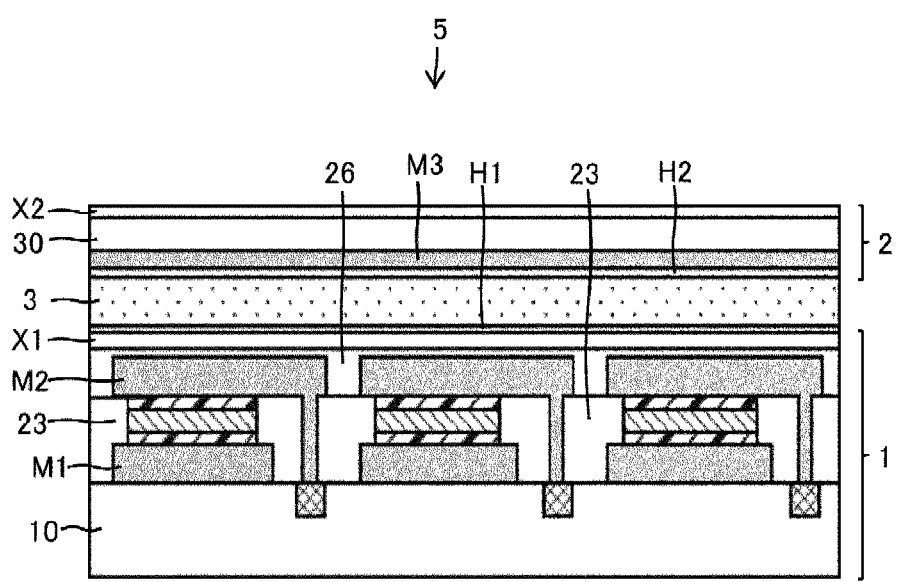
FIG. 6 is a cross-sectional view illustrating a modified example of the display device according to the first embodiment.

FIG. 6 is cross-sectional view illustrating a modified example of the display device according to the first embodiment. In FIG. 1, the second polarizer X2 is placed between the counter substrate 30 and the liquid crystal layer 3 (inside of the counter substrate 30), but a position of the second polarizer X2 is not limited thereto. As illustrated in FIG. 6, the second polarizer X2 may be placed outside the counter substrate 30 (above the third electrode M3). In this configuration, a polarizer that can be bonded to the counter substrate 30 can be used as the second polarizer X2, which facilitates manufacturing.

Although the optical adjustment element LS is provided in common across multiple subpixels in the first embodiment, the optical adjustment element LS may be provided individually for each cell. In this configuration, up to the second electrodes M2 are formed in FIG. 5(a), up to the second electrodes M2, which operate the optical adjustment elements LS (liquid crystal cells), are formed in FIG. 5(b), and then the second electrodes M2 are bonded to each other.

FIG. 7(a) is a cross-sectional view illustrating a further modified example of the display device according to the first embodiment, FIG. 7(b) is an explanatory diagram illustrating the potentials of the first to third electrodes, and FIG. 7(c) is an explanatory diagram illustrating operation of the display device. In FIG. 1, the second electrode M2 and the third electrode M3 are arranged in the layering direction (normal direction to the substrate), and a vertical electrical field is generated between the second electrode M2 and the third electrode M3, but the electrical field generated between the second electrode M2 and the third electrode M3 is not limited to the vertical electrical field. As illustrated in FIG. 7(a), by using liquid crystals that adopt a transverse electrical field control mode for the liquid crystal layer 3 and arranging the second electrode M2 and the third electrode M3 adjacent to each other in a planar direction (direction parallel to the substrate), a transverse electrical field may be generated between the second electrode M2 and the third electrode M3. The third electrode M3 is connected to the power source line PL that supplies the negative power supply voltage −Vo. In this configuration, the second electrodes M2 and the third electrodes M3 are formed in the same layer, thereby reducing the number of manufacturing steps and reducing manufacturing costs. Alternatively, the third electrode M3 may be formed in a comb-teeth shape so as to straddle the subpixels, and a common power supply voltage (−Vo) may be applied to the third electrode M3.

FIGS. 7(b) and 7(c) are similar to FIGS. 2(a) and 3(c). When the light-emitting layer EM is in the non-light emission state, the optical adjustment element LS is in the light blocking state and the subpixel is displayed in black gray scale.

On the other hand, when the light-emitting layer EM is in the light emission state, the optical adjustment element LS is in the light transmitting state, and the subpixel is displayed in gray levels to white gray scale. In FIG. 7, the polarization axis of the first polarizer X1 and the polarization axis of the second polarizer X2 are parallel, so in the light blocking state, the polarization direction of light incident on the liquid crystal layer 3 is rotated (preferably by 90 degrees) and in the light transmitting state, the polarization direction of light incident on the liquid crystal layer 3 is maintained.

According to the first embodiment, when the light-emitting layer EM is in the light emission state, the optical adjustment element LS is autonomously in the light transmitting state, and when the light-emitting layer EM is in the non-light emission state, the optical adjustment element LS is autonomously in the light blocking state to block external light incident from the viewing surface. Thus, light emission of the quantum dots due to external light (photoluminescence) is suppressed, enabling a high-contrast display that can display a deep (high-purity) black color.

Figure 8:
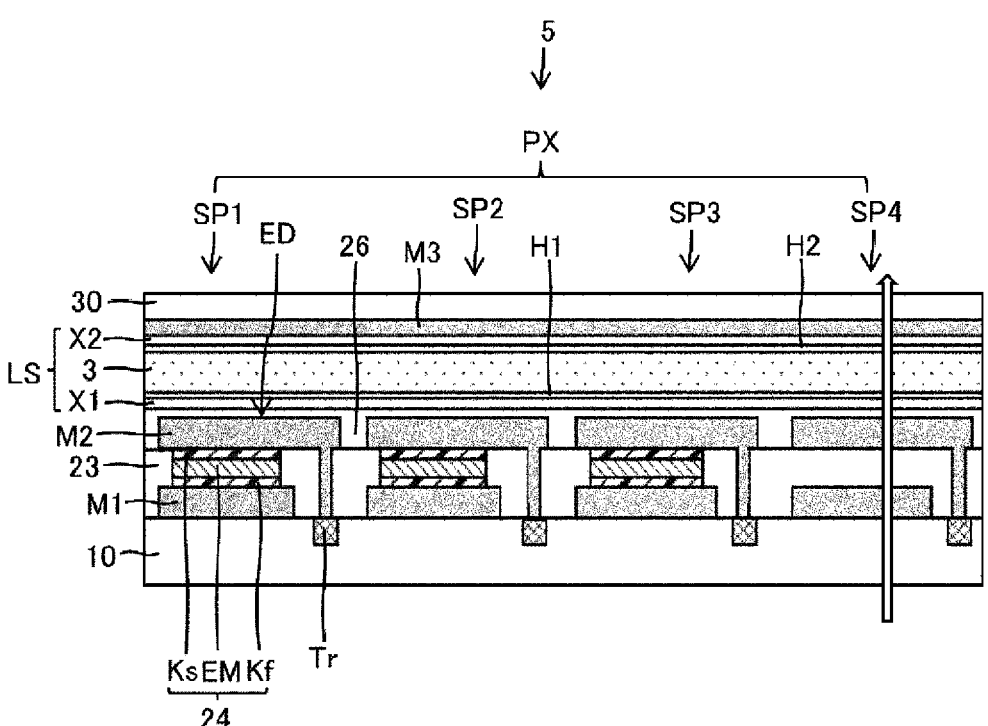
FIG. 8 is a cross-sectional view illustrating another configuration of the display device according to the first embodiment.

FIG. 8 is a cross-sectional view illustrating another configuration of the display device according to the first embodiment. For example, one pixel PX is formed by the subpixel SP1 that emits red light, the second subpixel SP2 that emits green light, the third subpixel SP3 that emits blue light, and a transparent fourth subpixel SP4. Visible light that passes through the fourth subpixel SP4 does not generate photoluminescence, thus enabling a high-purity black display with minimal influence of photoluminescence due to external light in a transparent display of one-sided viewing (viewing from the counter substrate side). By making the background visible through the subpixel SP3 that emits blue light, the subpixel SP3 may also serve as the fourth subpixel SP4, which is a transparent subpixel. This is because the subpixel that emits blue light does not generate photoluminescence due to external light. In this configuration, one pixel can be formed by three subpixels.

Second Embodiment

Figure 9:
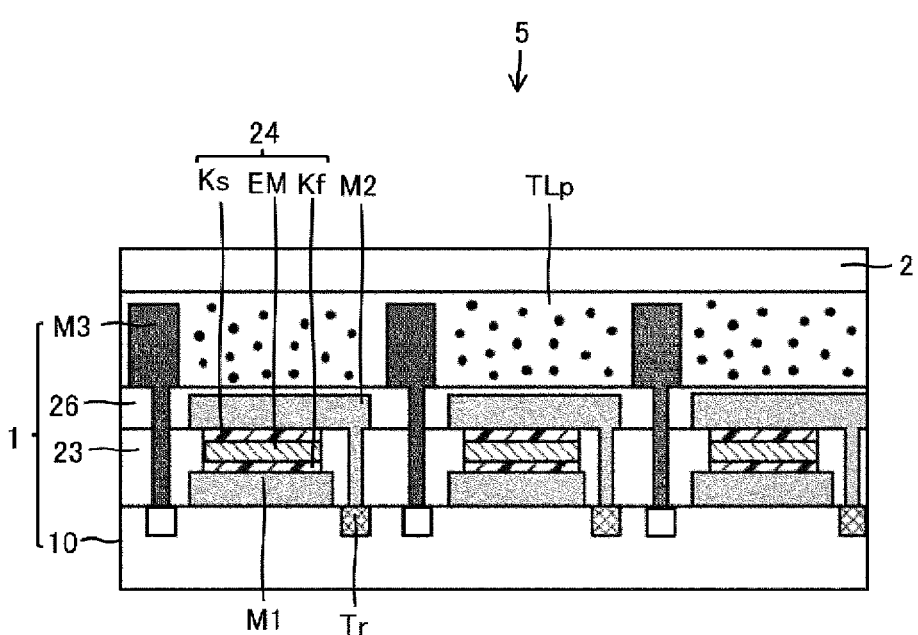
FIG. 9 is a cross-sectional view illustrating a configuration of a display device according to a second embodiment.

FIG. 9 is a cross-sectional view illustrating a configuration of a display device according to a second embodiment. As illustrated in FIG. 9, a display device 5 includes a first member 1, a second member 2 facing the first member 1, and an electrophoretic optical adjustment element TLp placed between the first member 1 and the second member 2. In the first member 1, first electrodes M1, an edge cover film 23, EL layers 24, second electrodes M2, a sealing layer 26, and third electrodes M3 are provided in this order on a TFT substrate 10 including multiple thin film transistors Tr.

The display device 5 is of a top emission type, and is viewed from a second member 2 side. The first electrode M1 has light reflectivity, and the second electrode M2, the sealing layer 26, and the second member 2 have a light transmitting property. The third electrode M3 has a light blocking property and does not overlap a light-emitting region of the light-emitting layer EM. In a plan view (when viewed from a viewing surface), an area of the third electrode M3 is smaller than an area of the second electrode M2.

FIG. 10(*a*) is an explanatory diagram illustrating potentials of the first to third electrodes according to the second embodiment, FIG. 10(*b*) is a cross-sectional view illustrating operation of the display device, FIG. 10(*c*) is an explanatory diagram illustrating the operation of the display device, and FIG. 10(*d*) is a graph showing a characteristic of voltage of the optical adjustment element and transmittance. In FIG. 10, a potential difference Vs is obtained by subtracting a potential VN of the third electrode M3 from a potential VA of the second electrode M2. The potential VA of the second electrode M2 is variable and the potential VN of the third electrode M3 is fixed. Since a power supply voltage Vo is applied between the first electrode M1 and the third electrode M3, and the first electrode M1 is grounded, the potential VN of the third electrode M3 is a value of Vo itself. The potential VA of the second electrode M2 is a value of the potential difference Va itself between the first electrode M1 and the second electrode M2. When no current is injected (no voltage is applied) to the second electrode M2, the potential difference Va is a divided voltage value Vaj determined by Equation 4 below based on a capacitance ratio between an element capacitance Ce and an electrophoretic layer capacitance Cj.

$$Vaj = Vo \times Ce/(Ce + Cj) \qquad \text{[Equation 4]}$$

Thus, when no current is injected into the second electrode M2, a value Vsj of the potential difference Vs is $-Vo \times Cj/(Ce+Cj)$, and when VA is Vmin or higher, the potential difference Vs is Vmin−Vo or greater.

The optical adjustment element TLp is an electrophoretic layer containing toner Tp having a positive charge. The optical adjustment element TLp is in a light blocking state when the potential difference Vs is negative, and is in a light transmitting state when the potential difference Vs is positive. The toner Tp is black, that is, the toner absorbs visible light, and for example, pigment fine particles or the like. A particle size may be about several µm. The toner Tp is contained in an isoparaffin-based transparent insulating liquid or the like so as to be movable when an electrical field is applied.

States of the optical adjustment element TLp include a light transmitting state in which the toner Tp gathers near a side surface of the third electrode M3 and does not overlap the light-emitting layer in a plan view, a light blocking state in which the toner Tp gathers near an upper surface of the second electrode M2 and overlaps the light-emitting layer in a plan view, and a transient state from the light blocking state to the light transmitting state. When the toner Tp gathers near the side surface of the third electrode M3, the toner Tp may or may not be in contact with the side surface. When the toner is not in contact with the side surface of the third electrode M3, a distance between the side surface and a particle of the toner Tp closest to the side surface is substantially the same as a distance between particles of the toner Tp. When the toner Tp gathers near the upper surface of the second electrode M2, the toner Tp may or may not be in contact with the upper surface. When the toner is not in contact with the upper surface of the second electrode M2, a distance between the upper surface and a particle of the toner Tp closest to the upper surface is substantially the same as a distance between particles of the toner Tp.

For the potential difference Vs, a threshold value from the light blocking state (the state in which the toner Tp gathers near the upper surface of the second electrode M2 and overlaps the light-emitting layer in a plan view) to the transient state (the state in which some of the toner Tp is away from the upper surface of the second electrode M2) is a third voltage Vth3 (<0), and a threshold value from the transient state to the light transmitting state (the state in which the toner Tp gathers near the side surface of the third electrode M3 and does not overlap the light-emitting layer in a plan view) is a fourth voltage Vth4 (≥0). Although the third voltage Vth3 and the fourth voltage Vth4 are never both 0, one of the third voltage Vth3 and the fourth voltage Vth4 may be 0.

As shown in FIG. 10(*d*), by setting the value Vsj of the potential difference Vs when no current is injected into the second electrode M2 to be less than the third voltage Vth3 and setting the potential difference Vs (=Vmin −Vo) when the potential VA is Vmin to be greater than the third voltage Vth3, when no current is injected into the second electrode M2, the optical adjustment element TLp is in the light blocking state, and when the potential VA is Vmin or higher, the optical adjustment element TLp is in the transient state or the light transmitting state. As an example, Vo=1.0 [V], Vth3=0.0 [V], Vmin=2.0 [V], and Vmax=5.0 [V] are assumed. Usually, the light-emitting layer EM has a relative dielectric constant Fe of about 8.0 and a film thickness De of about 50 nm, and the optical adjustment element TLp has a relative dielectric constant Fj of about 7.0 and a film thickness Dj of about 25 µm. Equation 5 holds for the electrophoretic layer capacitance Cj.

$$Cj = \varepsilon 0 \times \varepsilon j \times S/Dj \qquad \text{[Equation 5]}$$

From Equations 2, 4, and 5, when no current is injected into the second electrode M2, Vaj is 0.998 V and Vsj is −0.002 V, which is negative value smaller than Vth3. When Vmin is applied to the second electrode M2, Vs is 1.0 V, which is a positive value larger than Vth3.

In other words, during a non-light emission period in which the light-emitting layer EM is in a non-light emission state, the optical adjustment element TLp is in the light blocking state and the subpixel is displayed in black gray scale, and during a light emission period in which the light-emitting layer EM is in a light emission state, the optical adjustment element TLp is in the light transmitting state and the subpixel is displayed in gray levels to white gray scale.

According to the second embodiment, when the light-emitting layer EM is in the light emission state (light emission period), the optical adjustment element TLp is autonomously in the light transmitting state, and when the light-emitting layer EM is in the non-light emission state (non-light emission period), the optical adjustment element TLp is autonomously in the light blocking state to block external light incident from the viewing surface. Thus, light emission of the quantum dots due to external light (photoluminescence) is suppressed, enabling a high-contrast display that can display a deep (high-purity) black color.

When the light-emitting layer EM has low luminance and the transmittance of the optical adjustment element TLp is desired to be high, Vmin −Vo is set to be equal to or greater than Vth4. When the light-emitting layer EM has low luminance and the transmittance of the optical adjustment element TLp is desired to be low, Vmin −Vo is set to be less than Vth4.

Third Embodiment

Figure 11:
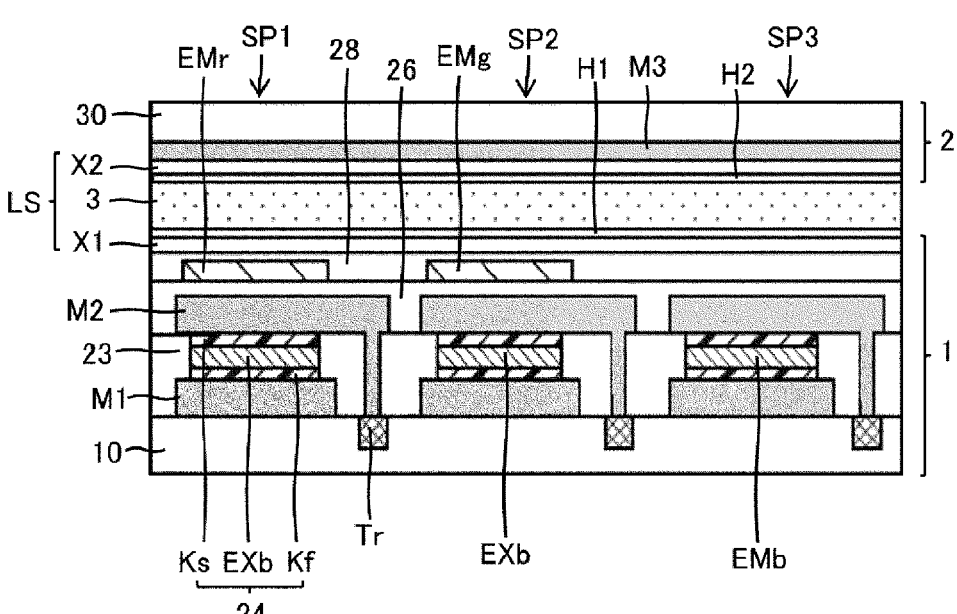
FIG. 11 is a cross-sectional view illustrating a configuration of a display device according to a third embodiment.

FIG. 11 is a cross-sectional view illustrating a configuration of a display device according to a third embodiment. As illustrated in FIG. 11, a display device 5 includes a first member 1, a second member 2 facing the first member 1, and a liquid crystal layer 3 placed between the first member 1 and the second member 2. In the first member 1, first electrodes M1, an edge cover film 23, EL layers 24, second electrodes M2, a sealing layer 26, wavelength conversion layers EMr and EMg, a sealing layer 28, a first polarizer X1, and a first alignment film H1 are provided in this order on the TFT substrate 10 including multiple thin film transistors Tr. In the second member 2, a third electrode M3, a second polarizer X2, and a second alignment film H2 are provided in this order on a counter substrate 30.

The wavelength conversion layers EMr and EMg contain quantum dots and have an optical wavelength conversion function by photoluminescence. The optical wavelength conversion function is a function of absorbing short wavelength light (excitation light, such as blue light) from an excitation light generating layer EXb and emitting long wavelength light (e.g., red light or green light). The excitation light generating layer EXb may be a quantum dot light-emitting layer containing quantum dots, or may be an organic light-emitting layer used in an organic light emitting diode (OLED).

Although each of the light-emitting layer EM (electroluminescent layer) described in the first and second embodiments and a light-emitting layer EMb in the third embodiment is provided between the first electrode M1 and the second electrode M2, the wavelength conversion layers EMr and EMg are placed closer to a viewing surface than the excitation light generating layers EXb in the subpixels including the wavelength conversion layers EMr and EMg. This is to prevent a viewer from directly viewing light from the excitation light generating layer EXb in the subpixel.

The display device 5 is of a top emission type and is viewed from a counter substrate 30 side. The first electrode M1 has light reflectivity and the second electrode M2, the sealing layers 26 and 28, the third electrode M3, and the counter substrate 30 have a light transmitting property.

The display device 5 in FIG. 11 includes a first subpixel SP1 that emits red light, a second subpixel SP2 that emits green light, and a third subpixel SP3 that emits blue light. The first subpixel SP1 includes the first electrode M1, the excitation light generating layer EXb, the second electrode M2, the wavelength conversion layer EMr (light-emitting layer), and the optical adjustment element LS. The excitation light generating layer EXb is placed between the first electrode M1 and the second electrode M2. In a plan view, the wavelength conversion layer EMr overlaps the first electrode M1, the excitation light generating layer EXb, the second electrode M2, and the optical adjustment element LS. The second subpixel SP2 includes the first electrode M1, the excitation light generating layer EXb, the second electrode M2, the wavelength conversion layer EMg (light-emitting layer), and the optical adjustment element LS. The excitation light generating layer EXb is placed between the first electrode M1 and the second electrode M2. In a plan view, the wavelength conversion layer EMg overlaps the first electrode M1, the excitation light generating layer EXb, the second electrode M2, and the optical adjustment element LS. The third subpixel SP3 includes the first electrode M1, the light-emitting layer EMb, the second electrode M2, and the optical adjustment element LS. The light-emitting layer EMb (electroluminescent layer) is placed between the first electrode M1 and the second electrode M2. In a plan view, the light-emitting layer EMb overlaps the first electrode M1, the second electrode M2, and the optical adjustment element LS. The third electrode M3 is common to the first subpixel SP1, the second subpixel SP2, and the third subpixel SP3.

In the third embodiment, the excitation light generating layers EXb of the first and second subpixels SP1 and SP2 generate blue light (excitation light) with luminance corresponding to an anode potential Va by electroluminescence. The wavelength conversion layer EMr of the first subpixel SP1 absorbs the blue light (excitation light) from the excitation light generating layer EXb and generates red light (luminance corresponding to Va) by photoluminescence, and the wavelength conversion layer EMg of the second subpixel SP2 absorbs the blue light (excitation light) from the excitation light generating layer EXb and generates green light (luminance corresponding to Va) by photoluminescence. Since the sealing layers 26 and 28 are insulating films, no current flows through the wavelength conversion layers EMr and EMg (no electroluminescence).

FIG. 12(a) is a schematic view illustrating a layered structure of the first subpixel and the second subpixel, FIG. 12(b) is a schematic view illustrating a layered structure of the third subpixel, and FIG. 12(c) is an explanatory diagram illustrating operation of the display device.

According to the third embodiment, when the wavelength conversion layers EMr and EMg and the light-emitting layer EMb are in a light emission state, the optical adjustment element LS autonomously is in a light transmitting state, and when the wavelength conversion layers EMr and EMg and the light-emitting layer EMb are in a non-light emission state, the optical adjustment element LS autonomously is in a light blocking state to block external light incident from the viewing surface. In particular, external light incident on the wavelength conversion layers EMr and EMg having the optical wavelength conversion function can be cut off. Thus, light emission from the wavelength conversion layers EMr and EMg and the light-emitting layer EMb due to external light is suppressed, enabling a high-contrast display that can display a deep (high-purity) black color.

The embodiments described above are for the purpose of illustration and description and are not intended to be limiting. It will be apparent to those skilled in the art that many variations will be possible in accordance with these examples and descriptions.

First Aspect

A display device includes a first electrode and a second electrode overlapping each other in a plan view, a light-emitting layer containing quantum dots and overlapping the first electrode and the second electrode, a third electrode capable of forming an electrical field between the second electrode and the third electrode, and an optical adjustment element overlapping the light-emitting layer in a plan view and having light transmittance that changes in accordance with a potential difference between the second electrode and the third electrode.

Second Aspect

In the display device according to, for example, the first aspect, the optical adjustment element is in one of multiple optical states in accordance with the potential difference.

Third Aspect

In the display device according to, for example, the first or the second aspect, in a case in which the potential difference exceeds a first voltage, the optical adjustment element switches from a light blocking state to a transient state, and in a case in which the potential difference exceeds a second voltage, the optical adjustment element switches from the transient state to a light transmitting state.

Fourth Aspect

In the display device according to, for example, the third aspect, during a non-light emission period of the light-emitting layer, the optical adjustment element is in the light blocking state, and during a light emission period of the light-emitting layer, the optical adjustment element is in the transient state or the light transmitting state.

Fifth Aspect

In the display device according to, for example, any one of the first to the fourth aspect, a potential of the first electrode and a potential of the third electrode are fixed.

Sixth Aspect

In the display device according to, for example, the fourth aspect, a potential of the second electrode during the light emission period is higher than a potential of the second electrode during the non-light emission period.

Seventh Aspect

In the display device according to, for example, the fifth or the sixth aspect, a potential of the first electrode is equal to or greater than a potential of the third electrode.

Eighth Aspect

In the display device according to, for example, the third aspect, the optical adjustment element includes a liquid crystal layer, and a first polarizer and a second polarizer having polarization axes parallel to each other, and the liquid crystal layer is placed between the first polarizer and the second polarizer.

Ninth Aspect

The display device according to, for example, the eighth aspect, in a case in which the optical adjustment element is in the light blocking state, a polarization direction of light incident on the liquid crystal layer is rotated by 90 degrees, and in a case in which the optical adjustment element is in the light transmitting state, a polarization direction of light incident on the liquid crystal layer is maintained.

Tenth Aspect

The display device according to, for example, the eighth aspect, includes a TFT substrate provided under the first electrode and the second electrode, in which the third electrode is provided above the first electrode and the second electrode, and the liquid crystal layer is placed between the second electrode and the third electrode.

Eleventh Aspect

In the display device according to, for example, the eighth aspect, between the second electrode and the third electrode, the first polarizer and the second polarizer are disposed.

Twelfth Aspect

In the display device according to, for example, the eighth aspect, between the second electrode and the third electrode, the first polarizer is placed, and the second polarizer is placed above the third electrode.

Thirteenth Aspect

In the display device according to, for example, any one of the 1st to the 12th aspects, the first electrode has light reflectivity, and the second electrode and the third electrode have a light transmitting property.

Fourteenth Aspect

In the display device according to, for example, the eighth aspect, the second electrode and the third electrode are provided adjacent to each other in a planar direction, and the liquid crystal layer adopts a transverse electrical field control mode.

Fifteenth Aspect

In the display device according to, for example, the second aspect, the optical adjustment element includes an electrophoretic layer containing multiple particles of toner movable by an electrical field between the second electrode and the third electrode.

Sixteenth Aspect

In the display device according to, for example, the 15th aspect, in a case in which the optical adjustment element is in a light blocking state, the toner overlaps the light-emitting layer in a plan view, and in a case in which the optical adjustment element is in a light transmitting state, the toner does not overlap the light-emitting layer in a plan view.

Seventeenth Aspect

In the display device according to, for example, the 16th aspect, in a case in which the potential difference exceeds a third voltage, the optical adjustment element switches from the light blocking state to a transient state, and in a case in which the potential difference exceeds a fourth voltage, the optical adjustment element switches from the transient state to the light transmitting state.

Eighteenth Aspect

In the display device according to, for example, the 17th aspect, during a non-light emission period of the light-emitting layer, the optical adjustment element is in the light blocking state, and during a light emission period of the light-emitting layer, the optical adjustment element is in the transient state or the light transmitting state.

Nineteenth Aspect

In the display device according to, for example, any one of the 1st to the 18th aspects, the light-emitting layer is an electroluminescent layer placed between the first electrode and the second electrode.

Twentieth Aspect

In the display device according to, for example, any one of the 1st to the 18th aspects, the light-emitting layer is a wavelength conversion layer placed closer to a viewing surface than the first electrode and the second electrode and configured to perform wavelength conversion by photoluminescence, and an excitation light generating layer configured to generate excitation light by electroluminescence is placed between the first electrode and the second electrode.

Twenty-First Aspect

In the display device according to, for example, the 20th aspect, the wavelength conversion layer absorbs blue light from the excitation light generating layer and emits red light or green light.

Twenty-Second Aspect

In the display device according to, for example, the 20th or the 21st aspect, the wavelength conversion layer is formed between the second electrode and the optical adjustment element.

Twenty-Third Aspect

The display device according to, for example, any one of the 1st to the 22nd aspects, includes a first subpixel configured to emit red light, a second subpixel configured to emit green light, and a third subpixel configured to emit blue light, in which each of the first subpixel, the second subpixel, and the third subpixel includes the light-emitting layer and the optical adjustment element, and the third electrode is common to the first subpixel, the second subpixel, and the third subpixel.

The invention claimed is:

1. A display device comprising:
   a first electrode and a second electrode overlapping each other in a plan view;
   a light-emitting layer containing quantum dots and overlapping the first electrode and the second electrode in the plan view;
   a third electrode capable of forming an electrical field between the second electrode and the third electrode; and
   an optical adjustment element overlapping the light-emitting layer in the plan view and having light transmittance that changes in accordance with a potential difference between the second electrode and the third electrode,
   wherein, in a case that the potential difference exceeds a first voltage, the optical adjustment element switches from a light blocking state to a transient state, and
   in a case that the potential difference exceeds a second voltage, the optical adjustment element switches from the transient state to a light transmitting state.

2. The display device according to claim 1,
   wherein the light-emitting layer is a wavelength conversion layer placed closer to a viewing surface than the first electrode and the second electrode, and is configured to perform wavelength conversion by photoluminescence, and
   an excitation light generating layer configured to generate excitation light by electroluminescence is placed between the first electrode and the second electrode.

3. The display device according to claim 2,
   wherein the wavelength conversion layer absorbs blue light from the excitation light generating layer and emits red light or green light.

4. The display device according to claim 1,
   wherein during a non-light emission period of the light-emitting layer, the optical adjustment element is in the light blocking state, and
   during a light emission period of the light-emitting layer, the optical adjustment element is in the transient state or the light transmitting state.

5. The display device according to claim 1,
   wherein a potential of the first electrode and a potential of the third electrode are fixed.

6. The display device according to claim 4,
   wherein a potential of the second electrode during the light emission period is higher than a potential of the second electrode during the non-light emission period.

7. The display device according to claim 5,
   wherein the potential of the first electrode is equal to or greater than the potential of the third electrode.

8. The display device according to claim 1,
   wherein the optical adjustment element includes a liquid crystal layer, and a first polarizer and a second polarizer having polarization axes parallel to each other, and
   the liquid crystal layer is placed between the first polarizer and the second polarizer.

9. The display device according to claim 8,
wherein, in a case that the optical adjustment element is
in the light blocking state, a polarization direction of
light incident on the liquid crystal layer is rotated by 90
degrees, and
in a case that the optical adjustment element is in the light
transmitting state, the polarization direction of the light
incident on the liquid crystal layer is maintained.

10. The display device according to claim 8, further
comprising:
a thin film transistor (TFT) substrate provided under the
first electrode and the second electrode and including a
thin film transistor,
wherein the third electrode is provided above the first
electrode and the second electrode, and
the liquid crystal layer is placed between the second
electrode and the third electrode.

11. The display device according to claim 8,
wherein the first polarizer and the second polarizer are
disposed between the second electrode and the third
electrode.

12. The display device according to claim 8,
wherein the first polarizer is placed between the second
electrode and the third electrode, and
the second polarizer is placed above the third electrode.

13. The display device according to claim 1,
wherein the first electrode has light reflectivity, and
the second electrode and the third electrode have a light
transmitting property.

14. The display device according to claim 8,
wherein the second electrode and the third electrode are
provided adjacent to each other in a planar direction,
and
the liquid crystal layer adopts a transverse electrical field
control mode.

18

15. The display device according to claim 1,
wherein the optical adjustment element is in one of a
plurality of optical states in accordance with the poten-
tial difference, and
the optical adjustment element includes an electrophoretic
layer containing a plurality of particles of toner mov-
able by the electrical field between the second electrode
and the third electrode.

16. The display device according to claim 15,
wherein, in a case that the optical adjustment element is
in the light blocking state, the toner overlaps the
light-emitting layer in the plan view, and
in a case that the optical adjustment element is in the light
transmitting state, the toner does not overlap the light-
emitting layer in the plan view.

17. The display device according to claim 1,
wherein, in a case that the potential difference exceeds a
third voltage, the optical adjustment element switches
from the light blocking state to the transient state, and
in a case that the potential difference exceeds a fourth
voltage, the optical adjustment element switches from
the transient state to the light transmitting state.

18. The display device according to claim 17,
wherein, during a non-light emission period of the light-
emitting layer, the optical adjustment element is in the
light blocking state, and
during a light emission period of the light-emitting layer,
the optical adjustment element is in the transient state
or the light transmitting state.

19. The display device according to claim 2,
wherein the wavelength conversion layer is formed
between the second electrode and the optical adjust-
ment element.

* * * * *